US012568692B2

(12) United States Patent
Nath et al.

(10) Patent No.: US 12,568,692 B2
(45) Date of Patent: Mar. 3, 2026

(54) SEMICONDUCTOR CONTROLLED RECTIFIER AND METHOD TO FORM SAME

(71) Applicant: GlobalFoundries U.S. Inc., Malta, NY (US)

(72) Inventors: Anindya Nath, Essex Junction, VT (US); Alain F. Loiseau, Williston, VT (US); Robert J. Gauthier, Jr., Williston, VT (US); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 659 days.

(21) Appl. No.: 17/895,153

(22) Filed: Aug. 25, 2022

(65) Prior Publication Data

US 2024/0072038 A1 Feb. 29, 2024

(51) Int. Cl.
H10D 89/60 (2025.01)
H01L 21/763 (2006.01)

(52) U.S. Cl.
CPC ......... H10D 89/713 (2025.01); H01L 21/763 (2013.01)

(58) Field of Classification Search
CPC ............................ H10D 89/713; H01L 21/763
USPC ......................................................... 257/154
See application file for complete search history.

(56) References Cited

U.S. PATENT DOCUMENTS

| | | | |
|---|---|---|---|
| 6,122,975 A | 9/2000 | Sridhar et al. | |
| 6,225,673 B1 | 5/2001 | Pendharkar et al. | |

| | | | |
|---|---|---|---|
| 6,627,507 | B2 | 9/2003 | Yuan |
| 6,770,918 | B2 | 8/2004 | Russ et al. |
| 7,145,187 | B1 | 12/2006 | Vashchenko et al. |
| 9,245,760 | B2 | 1/2016 | Mauder et al. |
| 9,324,849 | B2 | 4/2016 | Chung |
| 9,755,015 | B1 | 9/2017 | Phelps et al. |
| 10,192,779 | B1 | 1/2019 | Shank et al. |
| 10,727,327 | B2 | 7/2020 | Mishra et al. |
| 10,755,987 | B2 | 8/2020 | Mason et al. |
| 10,892,362 | B1 | 1/2021 | Toner et al. |
| 11,158,535 | B2 | 10/2021 | Shank et al. |
| 2004/0033666 | A1 | 2/2004 | Williams et al. |
| 2005/0020088 | A1 | 1/2005 | Trivedi |
| 2009/0309733 | A1 | 12/2009 | Moran et al. |
| 2011/0018060 | A1 | 1/2011 | Botula et al. |
| 2012/0225540 | A1 | 9/2012 | Schulze et al. |

(Continued)

OTHER PUBLICATIONS

Sanda et al., "Fabrication and Characterization of CMOSFETs on Porous Silicon for Novel Device Layer Transfer," IEDM Technical Digest, Dec. 5, 2005.

(Continued)

*Primary Examiner* — Norman D Richards
*Assistant Examiner* — Colin Russell Mccutcheon
(74) *Attorney, Agent, or Firm* — Francois Pagette; Hoffman Warnick LLC

(57) ABSTRACT

Embodiments of the disclosure provide a semiconductor controlled rectifier (SCR) structure and methods to form the same. The SCR structure may include a first polycrystalline semiconductor material on a first insulator and includes a first well therein. A monocrystalline semiconductor material is adjacent the first polycrystalline semiconductor material and includes an anode region and a cathode region therein. A second polycrystalline semiconductor material is on a second insulator and includes a second well therein.

14 Claims, 3 Drawing Sheets

(56)         References Cited

U.S. PATENT DOCUMENTS

| | | | |
|---|---|---|---|
| 2012/0235304 | A1 | 9/2012 | Huisinga et al. |
| 2014/0015002 | A1* | 1/2014 | Fonteneau ........... H10D 89/713 |
| | | | 257/133 |
| 2014/0127867 | A1* | 5/2014 | Chatty ..................... H02H 9/04 |
| | | | 438/133 |
| 2018/0175019 | A1 | 6/2018 | Yeh et al. |
| 2020/0176441 | A1* | 6/2020 | Gorbachov ............... H03F 1/26 |
| 2021/0066118 | A1 | 3/2021 | Abou-Khalil et al. |
| 2021/0159012 | A1 | 5/2021 | Colinge |
| 2021/0376159 | A1 | 12/2021 | Abou-Khalil et al. |
| 2024/0290776 | A1 | 8/2024 | Nath et al. |

OTHER PUBLICATIONS

Rack et al., "Small-and Large-Signal Performance up to 175 C of Low-Cost Porous Silicon Substrate for RF Applications," IEEE Transactions on Electron Devices, Apr. 2, 2018 IEEE, pp. 9, vol. 65, Issue 5.

Bomchil et al., "Porous Silicon: The Material and Its Applications in Silicon-On-Insulator Technologies," Applied Surface Science 41/42, Elsevier Science Publishers, Jan. 1990, pp. 604-613, vols. 41-42.

Unagami et al., "Structure of Porous Silicon Layer and Heat-Treatment Effect," J. Electrochem. Soc.: Solid-State Science and Technology, Aug. 1978, pp. 1339-1344.

Peng et al., "Ion Implantation of Porous Silicon," Rochester Institute of Technology RIT Scholar Works, Appl. Phys. Letters, vol. 64, No. 10, Jun. 4, 1998, 5 pages.

U.S. Appl. No. 17/942,233, filed Sep. 12, 2022 entitled Semiconductor Device Structures Isolated by Porous Semiconductor Material, 16 pages.

Nassiopoulou et al., "Porous Si as a substrate material for RF passive integration," 14th International Conference on Ultimate Integration on Silicon (ULIS), 2013, pp. 89-93, doi: 10.1109/ULIS. 2013.6523498.

Z. Liu, J. Vinson, L. Lou and J. J. Lou, "An Improved Bidirectional SCR Structure for Low-Triggering ESD Protection Applications," in IEEE Electron Device Letters, vol. 29, No. 4, pp. 360-362, Apr. 2008, doi: 10.1109/LED.2008.917111.

U.S. Appl. No. 18/173,313, Final Office Action dated Oct. 3, 2025, 12 pages.

U.S. Appl. No. 18/173,313, De Minimis Amendment to Final Office Action filed Oct. 14, 2025, 9 pages.

U.S. Appl. No. 18/173,313, Office Action dated Jun. 23, 2025, 19 pages.

U.S. Appl. No. 18/173,313, Amendment to Office Action filed Aug. 28, 2025, 13 pages.

U.S. Appl. No. 18/173,313, Notice of Allowance dated Nov. 5, 2025, 11 pages.

* cited by examiner

SEMICONDUCTOR CONTROLLED RECTIFIER AND METHOD TO FORM SAME

BACKGROUND

Field of the Invention

The present invention relates to semiconductor controlled rectifiers (SCRs) and, more particularly, to an SCR formed in polycrystalline semiconductor material wells and related methods to form the same.

Description of Related Art

Fails due to electrostatic discharge (ESD) may negatively affect the reliability of integrated circuits (ICs). IC designs typically include ESD protection devices (e.g., at input/output pads, at power pads, and between power domains). Semiconductor controlled rectifiers (SCRs) (e.g., silicon controlled rectifiers) are one type of an ESD device. In radio frequency (RF) circuits, the presence of semiconductor controlled rectifiers may impede the RF circuitry performance due to capacitive loading and ensuing effects on harmonics. Past efforts to mitigate these effects have included, e.g., switches for self-protection of the SCR. The presence of such protective switches, however, have also reduced the amount of ESD protection offered through the SCR.

SUMMARY

All aspects, examples and features mentioned herein can be combined in any technically possible way.

Embodiments of a structure disclosed herein provide structure including: a first polycrystalline semiconductor material on a first insulator, and including a first well therein; a monocrystalline semiconductor material adjacent the first polycrystalline semiconductor material, and including an anode region and a cathode region therein; and a second polycrystalline semiconductor material on a second insulator and including a second well therein.

Another aspect of the disclosure includes any of the preceding aspects, and wherein the monocrystalline semiconductor material includes a first region having a first doping type and a second region having a second doping type opposite the first doping type, wherein the anode region is within the first region and the cathode region is in the second region.

Another aspect of the disclosure includes any of the preceding aspects, and further including a gate structure on the monocrystalline semiconductor material between the anode region and the cathode region, and over a boundary between the first region and the second region of the monocrystalline semiconductor material.

Another aspect of the disclosure includes any of the preceding aspects, and further including: a first overlying insulator on the first polycrystalline semiconductor material between the first well and the anode region; and a second overlying insulator on the second polycrystalline semiconductor material between the second well and the cathode region.

Another aspect of the disclosure includes any of the preceding aspects, and further including a resistive semiconductor material below the first insulator, the monocrystalline semiconductor material, and the second insulator.

Another aspect of the disclosure includes any of the preceding aspects, and wherein the monocrystalline semiconductor material includes a first sidewall adjacent the first polycrystalline semiconductor material and the first insulator, and a second sidewall adjacent the second polycrystalline semiconductor material and the second insulator.

Another aspect of the disclosure includes any of the preceding aspects, and wherein the monocrystalline semiconductor material is within a triple well semiconductor structure.

Some embodiments of a structure disclosed herein provide a structure including: an n-type polycrystalline semiconductor material on a first insulator; a first N+ region within the n-type polycrystalline semiconductor material; a monocrystalline semiconductor material on a substrate and adjacent the n-type polycrystalline semiconductor material, the monocrystalline semiconductor material including an n-type region adjacent a p-type region; a p-type polycrystalline semiconductor material on a second insulator; a first P+ region within the p-type polycrystalline semiconductor material; a second P+ region within the n-type region of the monocrystalline semiconductor material; and a second N+ region within the p-type region of the monocrystalline semiconductor material.

Another aspect of the disclosure includes any of the preceding aspects, and further including a gate structure on the monocrystalline semiconductor material between the second P+ region and the second N+ region, and over a boundary between the n-type region and the p-type region of the monocrystalline semiconductor material.

Another aspect of the disclosure includes any of the preceding aspects, and further including: a first overlying insulator on the n-type polycrystalline semiconductor material between the first N+ region and the second P+ region; and a second overlying insulator on the p-type polycrystalline semiconductor material between the first P+ region and the second N+ region.

Another aspect of the disclosure includes any of the preceding aspects, and further including a resistive semiconductor material below the first insulator, the monocrystalline semiconductor material, and the second insulator.

Another aspect of the disclosure includes any of the preceding aspects, and wherein the monocrystalline semiconductor material includes a first sidewall adjacent the n-type polycrystalline semiconductor material and the first insulator, and a second sidewall adjacent the p-type polycrystalline semiconductor material and the second insulator.

Another aspect of the disclosure includes any of the preceding aspects, and wherein the monocrystalline semiconductor material is within a triple well semiconductor structure.

Additional embodiments of a structure disclosed herein provide a method including: forming a first polycrystalline semiconductor material on a first insulator; forming a first well within the first polycrystalline semiconductor material; forming a monocrystalline semiconductor material adjacent the first polycrystalline semiconductor material; forming an anode region and a cathode region within the monocrystalline semiconductor material; forming a second polycrystalline semiconductor material on a second insulator; and forming a second well within the second polycrystalline semiconductor material.

Another aspect of the disclosure includes any of the preceding aspects, and wherein forming the monocrystalline semiconductor material includes: forming a first region having a first doping type adjacent the first polycrystalline semiconductor material; and forming a second region having a second doping type opposite the first doping type adjacent the second polycrystalline semiconductor material, wherein the anode region is within the first region and the cathode region is in the second region.

Another aspect of the disclosure includes any of the preceding aspects, and further including forming a gate structure on the monocrystalline semiconductor material between the anode region and the cathode region, and over a boundary between the first region and the second region of the monocrystalline semiconductor material.

Another aspect of the disclosure includes any of the preceding aspects, and further including: forming a first overlying insulator on the first polycrystalline semiconductor material between the first well and the anode region; and forming a second overlying insulator on the second polycrystalline semiconductor material between the second well and the cathode region.

Another aspect of the disclosure includes any of the preceding aspects, and wherein forming the monocrystalline semiconductor material includes forming the monocrystalline semiconductor material over a resistive semiconductor material, wherein the resistive semiconductor material is below the first insulator and the second insulator.

Another aspect of the disclosure includes any of the preceding aspects, and wherein the monocrystalline semiconductor material a first sidewall adjacent the first polycrystalline semiconductor material and the first insulator, and a second sidewall adjacent the second polycrystalline semiconductor material and the second insulator.

Another aspect of the disclosure includes any of the preceding aspects, and wherein forming the monocrystalline semiconductor material includes forming a doped semiconductor within a triple well semiconductor structure.

BRIEF DESCRIPTION OF THE DRAWINGS

The present invention will be better understood from the following detailed description with reference to the drawings, which are not necessarily drawn to scale and in which.

DETAILED DESCRIPTION

Electrostatic discharge (ESD) events may negatively impact the reliability of integrated circuits (IC)s. IC designs typically include ESD protection devices (e.g., at input/ output pads, at power pads, and between power domains). SCRs (e.g., semiconductor controlled rectifiers) can be employed as ESD devices. In radio frequency (RF) circuits, the presence of semiconductor controlled rectifiers may impede the RF circuitry performance due to capacitive loading and ensuing effects on harmonics. Past efforts to mitigate these effects have included, e.g., switches for self-protection of the SCR. The presence of such protective switches, however, has also reduced the amount of ESD protection offered through the SCR.

Embodiments of a structure disclosed herein provide a semiconductor controlled rectifier (SCR) structure in which portions of the SCR are formed in polycrystalline semiconductor material. The SCR structure may include a first polycrystalline semiconductor material (e.g., polycrystalline silicon, otherwise known as "polysilicon" or "poly-Si") on a first insulator, e.g., a shallow trench isolation (STI) or other insulative material. The first polycrystalline semiconductor material includes a first well (i.e., a portion of semiconductor having a relatively high dopant concentration) therein. A monocrystalline semiconductor material (e.g., single-crystal silicon) may be adjacent the first polycrystalline semiconductor material. The monocrystalline semiconductor material may include an anode and cathode (i.e., oppositely doped semiconductor wells) therein. A second polycrystalline semiconductor material is adjacent the monocrystalline semiconductor material and over a second insulator. A second well is within the second polycrystalline semiconductor material. In this configuration, the monocrystalline semiconductor material is horizontally between the first and second polycrystalline semiconductor materials. Together, the first polycrystalline semiconductor material, the monocrystalline semiconductor material, and the second polycrystalline semiconductor material define respective portions of the SCR. Among other technical benefits, embodiments of the disclosure reduce capacitive losses due to the presence of polycrystalline semiconductor materials, rather than single-crystal or other types of monocrystalline semiconductor materials, adjacent insulative barriers. The polycrystalline semiconductor material, in addition, increases well-to-contact resistance within the SCR, further reducing current leakage through the SCR when an ESD event is not ongoing.

Figure 1:
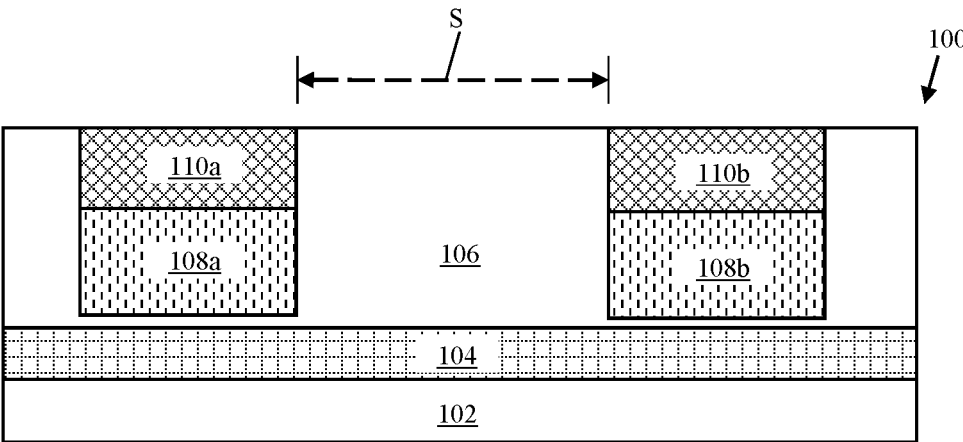
FIG. 1 depicts a cross-sectional view of an initial structure to be processed in methods according to embodiments of the disclosure.

FIG. 1 depicts an initial structure (simply "structure" hereafter) 100 to be processed into an SCR structure according to embodiments of the disclosure. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various components (e.g., various doped wells, doped semiconductor materials, trench isolation regions, etc.) may be formed above a resistive region 104 on substrate 102. Resistive region 104 may be formed on or within substrate 102, e.g., by converting a portion of semiconductor material within substrate 102 into a higher-resistive material such as amorphous semiconductor (e.g., a-Si) or polycrystalline semiconductor material (e.g., poly-Si). Resistive region 104 may extend horizontally throughout substrate 102, and/or may be formed selectively under locations where doped materials are formed, examples of which are discussed elsewhere herein. In further implementations, resistive region 104 may include oxygen doping to form a dielectric insulator or a buried oxide ("BOX") layer on substrate 102 to electrically isolate overlying doped semiconductor materials. In further implementations, resistive region 104 may include other implanted elements or molecules such as Ge, N, or Si. However embodied, resistive region 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive region 104, and/or multiple resistive regions 104 may be formed within substrate 102 at various positions. Portions of semiconductor material located above resistive region 104 may be identified separately herein as an overlying substrate 106. Overlying substrate 106 may have the same composition as substrate 102 and may be distinguished from substrate 102 solely based on its position above resistive region 104.

Structure 100 may include one or more trench isolation (TI) regions 108, separately identified as TI 108*a* and TI 108*b* in respective positions. TI(s) 108*a*, 108*b* are included in structure 100, e.g., to electrically insulate various conductive and/or doped materials from each other in structure 100 and the eventual SCR structure(s). TI(s) 108*a*, 108*b* may be formed by forming trenches (not shown) within overlying substrate 106 and filling such trenches with an insulating material such as oxide, to isolate various materials within overlying substrate 106 from another. TI(s) 108*a*, 108*b* may include various insulating materials, oxide and/or nitride insulators. According to one example, two TIs 108*a*, 108*b* are formed, but more or fewer TIs 108*a*, 108*b* may be formed in various embodiments discussed herein.

Structure 100 may include polycrystalline semiconductor material 110 in multiple regions, each being over one TI 108*a*, 108*b*. Polycrystalline semiconductor materials 110 may be identified as polycrystalline semiconductor material 110*a*, 110*b* in their respective positions. Polycrystalline semiconductor material 110*a*, 110*b* (e.g., polycrystalline silicon, also known as "polysilicon" or "poly-Si"), is distinct from other types of semiconductor material by featuring multiple single-crystalline (i.e., monocrystalline) regions of distinct size and orientation throughout its composition. The varied monocrystalline regions within polycrystalline semiconductor material 110*a*, 110*b* may be introduced, e.g., by introducing various dopants and/or other impurities within a semiconductor material to create internal crystal boundaries as the semiconductor material is formed. In embodiments of the disclosure, such impurities in the crystal structure may be introduced simply by epitaxially growing additional semiconductor material on the previously formed TI(s) 108*a*, 108*b*. Thus, structure 100 may include polycrystalline semiconductor materials 110*a*, 110*b* each located over a respective TI 108*a*, 108*b*. A substantially identical separation distance S (e.g., approximately 0.7 micrometers (μm) to approximately 1.0 μm) may be horizontally between TIs 108*a*, 108*b* and polycrystalline semiconductor materials 110*a*, 110*b* in structure 100. Separation distance S allows further portions of an eventual SCR structure, including doped semiconductor regions of varying polarity, to be formed between polycrystalline semiconductor materials 110*a*, 110*b*.

Figure 2:
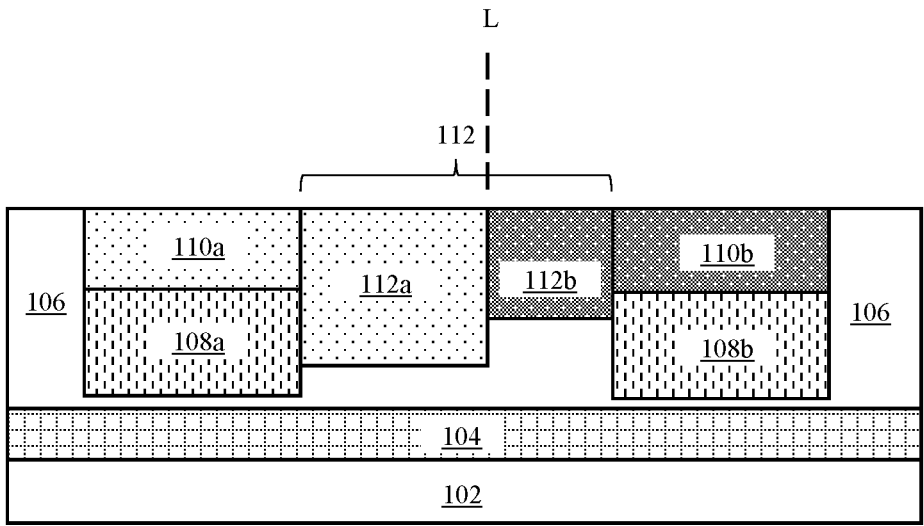
FIGS. 2-4 depict cross-sectional views of processes to form a semiconductor controlled rectifier (SCR) structure in methods according to embodiments of the disclosure.

FIG. 2 depicts processes to form and dope monocrystalline semiconductor material 112 horizontally between polycrystalline semiconductor materials 110*a*, 110*b*, as well as doping of semiconductor materials 110*a*, 110*b*, 112 to produce varyingly doped regions over substrate 102. A remaining portion of overlying substrate 106 between polycrystalline semiconductor materials 110*a*, 110*b* initially may define a monocrystalline semiconductor material area having insufficient doping levels to provide p-type or n-type doping between polycrystalline semiconductor materials 110*a*, 110*b*. Various conductive particles ("dopants") may be introduced into portions of overlying substrate 106 and/or polycrystalline semiconductor materials 110*a*, 110*b* above resistive region 104, e.g., to define a set of doped regions having varied polarities and/or concentrations. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter (cm $^{-2}$) and an energy level (specified in keV, kilo-electron-volts), resulting in a doping level (concentration in the substrate) of a number of atoms per cubic centimeter (cm$^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/cm$^2$, and an energy of about 40 to 80 keV to produce a doping level of between 1E17 and 1E18 atoms/cm$^3$.

A first region 112*a* of monocrystalline semiconductor material 112 (i.e., on one side of a doping boundary L) and first polycrystalline semiconductor material 110*a* may have a first doping type (e.g., n-type doping). The doping of semiconductor materials 110*a*, 112*a* may be implemented by forming a mask over semiconductor material(s) on the other side of doping boundary L to prevent semiconductor material(s) thereunder from being doped. A second region 112*b* of monocrystalline semiconductor material 112 (i.e., on the opposite side of doping boundary L) and second polycrystalline semiconductor material 110*b* may have a second doping type (e.g., p-type doping). The doping of semiconductor materials 110*b*, 112*b* may be implemented by forming a different mask over semiconductor material(s) on the opposite side of doping boundary L, e.g., to now prevent semiconductor materials 110*a*, 112*a* from being doped with the opposite doping type. It is understood that the doping of semiconductor materials 110*a*, 112*a* and semiconductor materials 110*b*, 112*b* may be implemented in any desired order, i.e., either may be doped before the other and/or may be doped with opposite polarity dopants to suit a particular setting. As shown, the doped first region 112*a* of monocrystalline semiconductor material 112 may extend to a depth that is below second region 112*b*. However, each region 112*a*, 112*b* of monocrystalline semiconductor material 112 may be at least partially adjacent STI(s) 108*a*, 108*b*, in addition to being adjacent a respective polycrystalline semiconductor material 110*a*, 110*b*

Figure 3:
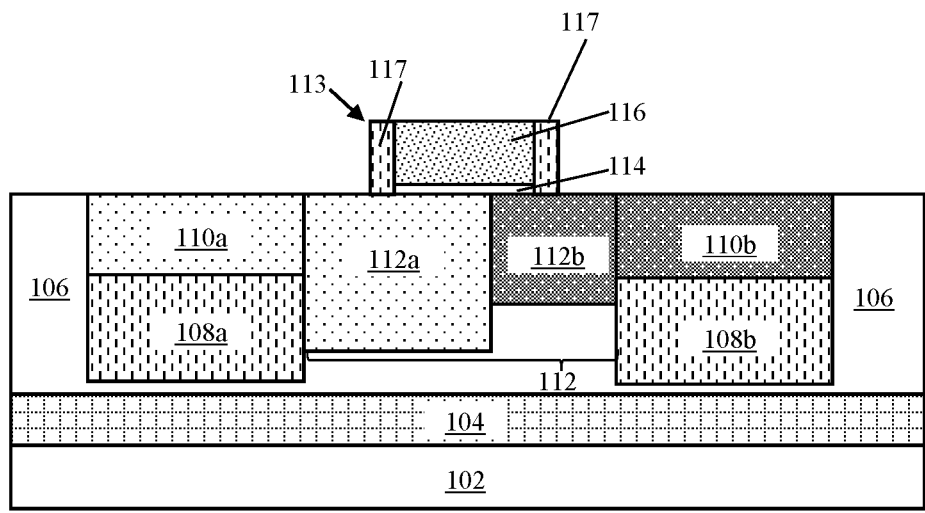

As shown in FIG. 3, embodiments of the disclosure may include forming a gate structure 113 over monocrystalline semiconductor material 112 horizontally between polycrystalline semiconductor materials 110*a*, 110*b*. Gate structure 113 may include multiple subcomponents, including a gate dielectric layer 114 (e.g., a dielectric layer with a high dielectric constant ("high-k," indicating a k value of at least approximately 3.9)) on monocrystalline semiconductor material 112 and a gate conductor layer 116 (e.g., a gate metal, metal alloy or other suitable gate conductor material layer) thereon. Such subcomponents of gate structure 113 are generally well understood in the art and thus not discussed in further detail herein. Gate structure 113 may be formed, e.g., by depositing dielectric layer 114 on monocrystalline semiconductor material 112 and depositing gate conductor layer 116 on dielectric layer 114. Further processing of gate structure 113 may include, e.g., forming a set of sidewall spacers 117 along the horizontal sidewalls of dielectric layer 114 and gate conductor layer 116. Sidewall spacers 117 may have the same composition and/or similar compositions to other insulative materials discussed herein, and may be prevent conductive pathways from forming to any components that are adjacent to gate structure 113. After polycrystalline semiconductor material 110a, 110b and regions 112a, 112b of monocrystalline semiconductor material are doped and gate structure 113 is formed, various doped wells may be formed within semiconductor materials 110, 112 to define alternating P and N semiconductor materials for an SCR structure.

Figure 4:
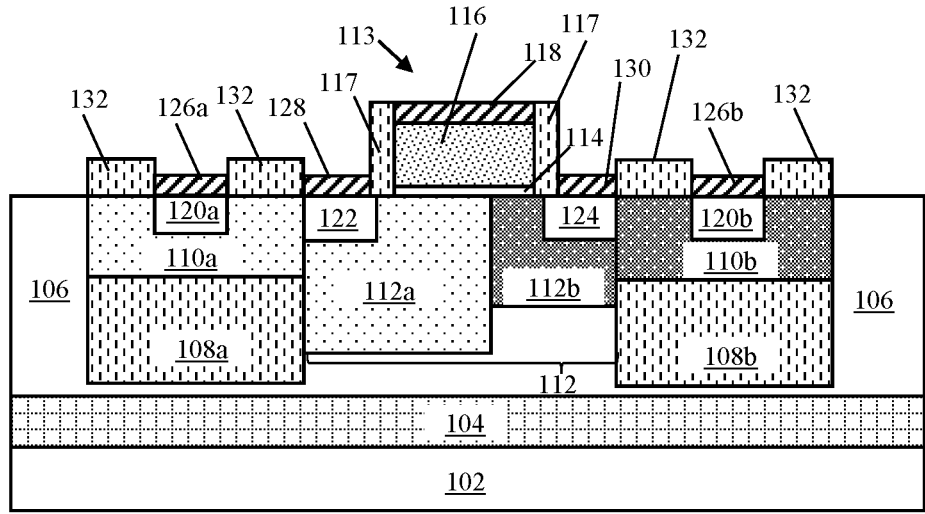

FIG. 4 depicts forming a first well 120a within polycrystalline semiconductor material 110a, a second well 120b within polycrystalline semiconductor material 110b, an anode 122 within first region 112a of monocrystalline semiconductor material 112, and a cathode 124 within second region 112b of monocrystalline semiconductor material 112. Each well 120a, 120b may have the same doping type as its respective polycrystalline semiconductor material 110a, 110b, e.g., first well 120a may be doped n-type whereas second well 120b may be doped p-type. By contrast, anode 122 and cathode 124 may have the opposite doping type relative to the region 112a, 112b of monocrystalline semiconductor material 112 in which they are located. Thus, anode 122 may be doped p-type when first region 112a is doped n-type, and cathode 124 may be doped n-type when second region 112b is doped p-type, and vice-versa. Together, polycrystalline semiconductor material 110a, anode 122, cathode 124, and polycrystalline semiconductor material 110b define an alternating set of P-N-P-N doped materials for an SCR structure. Gate structure 113 may be horizontally between anode 122 and cathode 124, such that a voltage applied to gate structure 113 will control current flow therebetween.

To electrically couple polycrystalline semiconductor materials 110a, 110b, gate structure 113, anode 122, and cathode 124 to overlying circuitry, embodiments of the disclosure include forming conductive materials on conductive portions of the structure. Specifically, a gate silicide 118 may be formed to gate structure 113, a first well silicide 126a may be formed to first well 120a, a second well silicide 126b may be formed to second well 120b, an anode silicide 128 may be formed to anode 122, and a cathode silicide 130 may be formed to cathode 124. Silicides 118, 126a, 126b, 128, 130 may be formed by forming various conductive materials on conductive or other active semiconductor materials, e.g., by depositing a layer of conductive metal, annealing the conductive metal such that it migrates into underlying material(s), and removing excess metal(s) after the annealing concludes. Each silicide 118, 126a, 126b, 128, 130 may include any currently known or later developed conductive material configured for reacting with semiconductor to form a silicide material, e.g., copper (Cu), aluminum (Al), Nickel (Ni) etc.

FIG. 4 also depicts the forming of overlying insulators 132 on portions of polysilicon semiconductor materials 110a, 110b where silicides 126a, 126b are not present. Overlying insulators 132 may have the same and/or similar materials to those within TIs 108a, 108b, e.g., various oxide and/or nitride insulators. Overlying insulators 132 may be formed by conformal deposition of insulative materials on exposed horizontal surfaces, and/or forming a mask on silicides 118, 126a, 126b, 128, 130 followed by non-conformal deposition of insulator to a desired thickness. The forming of overlying insulators 132 thereby prevent electrical shorts from forming between two or more of silicides 118, 126a, 126b, 128, 130 during operation.

Figure 5:
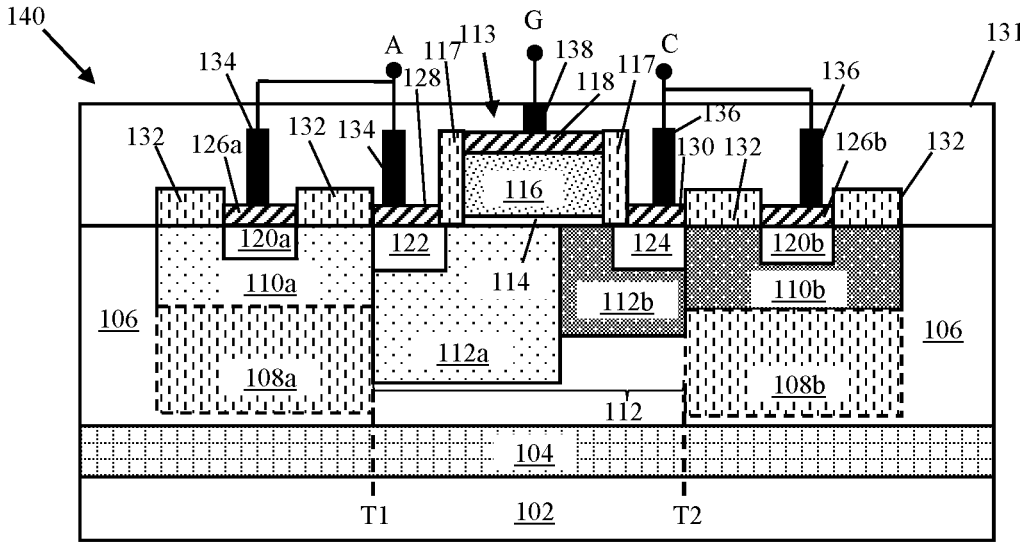
FIG. 5 depicts a cross-sectional view of an SCR structure according to embodiments of the disclosure.

As shown in FIG. 5, further processing may include forming an inter-level dielectric (ILD) 131 over gate structure 113, silicides 118, 126a, 126b, 128, 130, and overlying insulators 132 to vertically separate the various semiconductor and conductive materials from metal level wires of a device. ILD 131 may be formed, e.g., by forming an additional layer of insulating material to cover all previously formed material(s). The insulative material then can be planarized to define a flat upper surface, regardless of how many underlying materials and/or structures ILD 131 covers. To electrically couple the various structures beneath ILD 131 to overlying metal level layers (not shown), further processing may include forming openings within ILD 131 and filling the openings with conductive materials to define vertically-oriented electrical pathways. To define the anode, cathode, and gate terminals of an SCR, the disclosure may include forming a set of anode contacts 134 to first well 120a and anode 122, a set of cathode contacts 136 to second well 120b and cathode 124, and a gate contact 138 to gate structure 113. Each contact 134, 136, 138 may be formed to a respective silicide 118, 126a, 126b, 128, 130, e.g., by forming an opening (not shown) within ILD 131 and filling the opening with one or more conductive metals (e.g., Cu, Al, etc.) to form a vertical pathway to overlying metal level wires. Contacts 134, 136, 138 additionally may have refractory metal liners (not shown) thereon to prevent electromigration degradation, shorting to other components, etc.

The resulting materials thereby define an SCR structure 140 having a cathode C, an anode A, and a gate G therebetween. SCR structure 140 includes first polycrystalline semiconductor material 110a on an insulator (e.g., first TI 108a), and first well 120a therein. SCR structure 140 also includes monocrystalline semiconductor material 112 adjacent first polycrystalline semiconductor material 110a, and in which lower portions of monocrystalline semiconductor material 112 are adjacent TI(s) 108a, 108b. Second polycrystalline semiconductor material 110b of SCR structure 140 is adjacent monocrystalline semiconductor material 112 at the opposite end from first monocrystalline semiconductor material 110a. Thus, monocrystalline semiconductor material 112 may include a first sidewall T1 adjacent first polycrystalline semiconductor material 110a and TI 108a, and a second sidewall T2 adjacent second polycrystalline semiconductor material 110b and TI 108b. Second monocrystalline semiconductor material 110b is on another insulator (e.g., TI 108b) and includes second well 120b therein. Monocrystalline semiconductor material 112, as discussed herein, may include first region 112a having one doping type (e.g., n-type doping) and second region 112b having the opposite doping type (e.g., p-type doping). Regions 112a, 112b may have distinct depths, e.g., such that first region 112a extends deeper into overlying substrate 106 than second region 112b or vice-versa. Anode 122 may be within first region 112a and cathode 124 may be within second region 112b. Wells 120a, 120b, anode 122, and cathode 124 may have higher dopant concentrations than other semiconductor materials of SCR structure 140. For instance, first well 120a and cathode 124 may have substantially higher n-type doping than first polycrystalline semiconductor material 110a or first region 112a to define "N+" regions within SCR structure 140. Similarly, second well 120b and anode 122 may have substantially higher p-type doping than second polycrystalline semiconductor material 110*b* or second region 112*b* to define "P+" regions within SCR 140.

The alternating P+ and N+ regions within SCR structure 140 may define alternating P-N-P-N to produce the desired resistive current pathway from cathode terminal C to anode terminal A. A sufficiently high current applied to gate structure 113 through gate terminal G (e.g., created during an ESD event) may simultaneously enable current flow between cathode terminal C and anode terminal A, and may prevent such a current flow after the applied current ceases (e.g., the ESD event ends). To prevent parasitic losses within SCR structure 140 in any operating state, polycrystalline semiconductor materials 110*a*, 110*b* and the position of insulators such as TIs 108*a*, 108*b* will reduce the planes of contact between monocrystalline semiconductor material 112 and adjacent doped material(s). The reduced planes of contact, in turn, create less space for parasitic capacitive and/or diode junctions to form. To further reduce electrical losses within SCR structure 140, overlying insulators 132 may be on polycrystalline semiconductor materials 110*a*, 110*b* in positions where silicides 126*a*, 126*b* are not present, thus preventing current flow between silicides 126*a*, 126*b*, 128, 130. As previously discussed, SCR structure 140 optionally may include resistive region 104 (e.g., a layer of resistive semiconductor material) below overlying substrate 106 to further prevent electrical pathways into or out of SCR structure 140.

Figure 6:
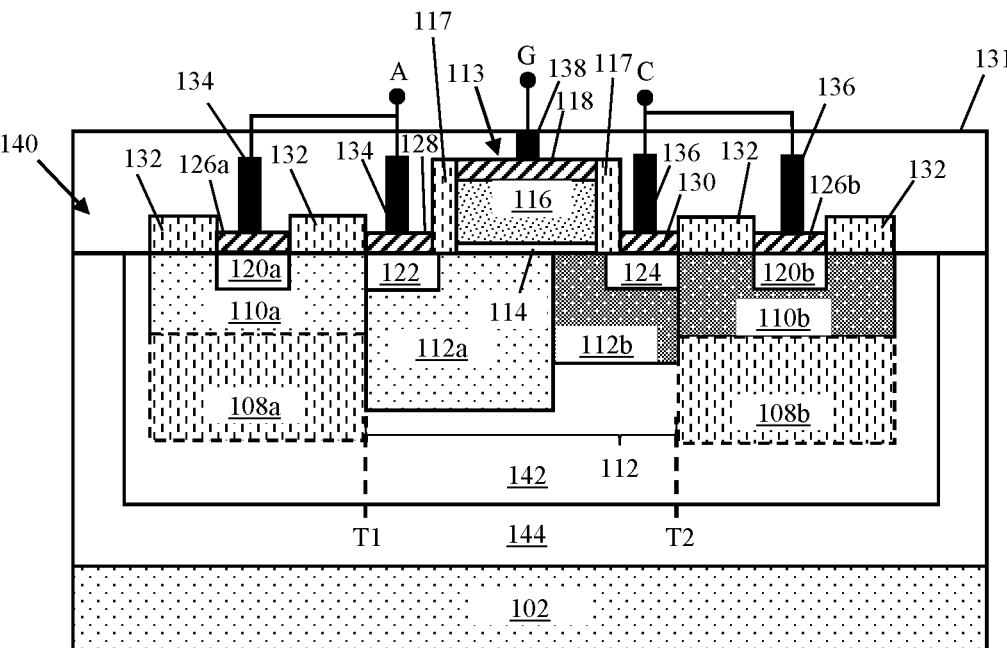
FIG. 6 depicts a cross-sectional view of an SCR structure on a triple well structure according to further embodiments of the disclosure.

FIG. 6 depicts a further embodiments of SCR structure 140 in which first polycrystalline semiconductor material 110*a*, second polycrystalline semiconductor material 110*b*, and monocrystalline semiconductor material 112 are formed on a triple well semiconductor structure. A "triple well" semiconductor structure refers to a type of integrated circuit device featuring three wells of alternating polarity, in which a first well has a second well therein, and the second well in turn has a third well therein. The first well and the third well may have a same doping polarity, while the second well may have an opposite doping polarity. In some cases, resistive region 104 may be omitted from SCR 140 when it is formed within a triple well semiconductor structure. According to an embodiment, first polycrystalline semiconductor material 110*a*, second polycrystalline semiconductor material 110*b*, and monocrystalline semiconductor material 112 each may define "shallow wells" of semiconductor material located within a middle well 142. Middle well 142 may be doped p-type or n-type, but with a lower dopant concentration than any of the semiconductor materials defining first polycrystalline semiconductor material 110*a*, second polycrystalline semiconductor material 110*b*, and monocrystalline semiconductor material 112. Middle well 142 itself may be within a deep well 144, having an opposite doping type from middle well 142 and a still lower concentration of dopants therein. Deep well 144 may be on substrate 102, and optionally may be on an upper surface of substrate 102 without resistive semiconductor material 104 being present. Triple well semiconductor structures may be preferable when SCR 140 is to be implemented in a standard cell architecture for a device, e.g., by offering reduced noise and signal coupling of a device through substrate 102. It is also understood that embodiments of SCR structure 140 may be implemented on other types of semiconductor device configurations, e.g., twin well structures and/or any other desired complementary metal oxide semiconductor (CMOS) configurations.

Embodiments of the disclosure provide various technical and commercial advantages, examples of which are discussed herein. The presence and position of polycrystalline semiconductor materials 110*a*, 110*b* adjacent monocrystalline semiconductor material 112 causes SCR structure 140 to exhibit lower capacitance, and thus less structural degradation during ESD events. These advantages may be especially pronounced when SCR structure 140 is implemented in radio frequency (RF) devices. Other characteristics of SCR structure 140 include, e.g., significantly higher resistance through well silicides 126*a*, 126*b* due to the presence of polycrystalline semiconductor material 110*a*, 110*b* thereunder, thus further preventing any current flow when an ESD event is not occurring. The presence of monocrystalline semiconductor material 112 between polycrystalline semiconductor materials 110*a*, 110*b* maintains an ESD current pathway through SCR structure 140, but polycrystalline semiconductor materials 110*a*, 110*b* will protect SCR structure 140 from degradation. SCR structure 140 also has a configuration that is compatible with existing manufacturing processes, any only requires portions of semiconductor material to be converted into polycrystalline semiconductor material (e.g., by etching and growth of polycrystalline semiconductor material on insulator) partway through other processing methods.

In the description of the structure embodiments above, reference is made to semiconductor features including, but not limited to, substrates, layers, regions, portions, terminals, etc. and to the conductivity types (e.g., P-type or N-type) of those features. Such features are made up of one or more semiconductor materials and a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductor materials (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve the different conductivity types (e.g., P-type conductivity and N-type conductivity) and that dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in each semiconductor region.

The terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first polycrystalline semiconductor material on a first insulator, and including a first well therein, wherein a lower surface of the first polycrystalline semiconductor material interfaces with an upper surface of the first insulator;
a monocrystalline semiconductor material adjacent the first polycrystalline semiconductor material, and including an anode region and a cathode region therein, wherein the anode region and the cathode region each have a different depth below an upper surface of the monocrystalline semiconductor material; and
a second polycrystalline semiconductor material on a second insulator, laterally distal to the monocrystalline semiconductor material and including a second well therein, wherein a lower surface of the second polycrystalline semiconductor material interfaces with an upper surface of the second insulator, and the anode region and the cathode region each include a lower portion adjacent a respective one of the first insulator or the second insulator.

2. The structure of claim 1, wherein the monocrystalline semiconductor material includes a first region having a first doping type and a second region having a second doping type opposite the first doping type, wherein the anode region is within the first region and the cathode region is in the second region.

3. The structure of claim 2, further comprising a gate structure on the monocrystalline semiconductor material between the anode region and the cathode region, and over a boundary between the first region and the second region of the monocrystalline semiconductor material.

4. The structure of claim 3, further comprising:
a first overlying insulator on the first polycrystalline semiconductor material between the first well and the anode region; and
a second overlying insulator on the second polycrystalline semiconductor material between the second well and the cathode region.

5. The structure of claim 1, further comprising a resistive semiconductor material below the first insulator, the monocrystalline semiconductor material, and the second insulator.

6. The structure of claim 1, wherein the monocrystalline semiconductor material includes a first sidewall adjacent the first polycrystalline semiconductor material and the first insulator, and a second sidewall adjacent the second polycrystalline semiconductor material and the second insulator.

7. The structure of claim 1, wherein the monocrystalline semiconductor material is within a triple well semiconductor structure.

8. A method comprising:
forming a first polycrystalline semiconductor material on a first insulator, wherein a lower surface of the first polycrystalline semiconductor material interfaces with an upper surface of the first insulator;
forming a first well within the first polycrystalline semiconductor material;
forming a monocrystalline semiconductor material adjacent the first polycrystalline semiconductor material;
forming an anode region and a cathode region within the monocrystalline semiconductor material;
forming a second polycrystalline semiconductor material on a second insulator and laterally distal to the monocrystalline semiconductor material, wherein a lower surface of the second polycrystalline semiconductor material interfaces with an upper surface of the second insulator, and the anode region and the cathode region each have a different depth below an upper surface of the monocrystalline semiconductor material; and
forming a second well within the second polycrystalline semiconductor material, wherein the anode region and the cathode region each include a lower portion adjacent a respective one of the first insulator or the second insulator.

9. The method of claim 8, wherein forming the monocrystalline semiconductor material includes:
forming a first region having a first doping type adjacent the first polycrystalline semiconductor material; and
forming a second region having a second doping type opposite the first doping type adjacent the second polycrystalline semiconductor material, wherein the anode region is within the first region and the cathode region is in the second region.

10. The method of claim 9, further comprising forming a gate structure on the monocrystalline semiconductor material between the anode region and the cathode region, and over a boundary between the first region and the second region of the monocrystalline semiconductor material.

11. The method of claim 10, further comprising:

forming a first overlying insulator on the first polycrystalline semiconductor material between the first well and the anode region; and forming a second overlying insulator on the second polycrystalline semiconductor material between the second well and the cathode region.

12. The method of claim 8, wherein forming the monocrystalline semiconductor material includes forming the monocrystalline semiconductor material over a resistive semiconductor material, wherein the resistive semiconductor material is below the first insulator and the second insulator.

13. The method of claim 8, wherein the monocrystalline semiconductor material includes a first sidewall adjacent the first polycrystalline semiconductor material and the first insulator, and a second sidewall adjacent the second polycrystalline semiconductor material and the second insulator.

14. The method of claim 8, wherein forming the monocrystalline semiconductor material includes forming a doped semiconductor within a triple well semiconductor structure.

* * * * *